Nov. 28, 1972 J. R. A. BEALE 3,704,177

METHODS OF MANUFACTURING A SEMICONDUCTOR DEVICE

Filed Dec. 15, 1970 4 Sheets-Sheet 1

*INVENTOR.*

JULIAN R. A. BEALE

*BY*

AGENT

INVENTOR.

JULIAN R. A. BEALE

BY

Frank R. Trifari

AGENT

*INVENTOR.*
JULIAN R.A. BEALE
*BY*
Frank R. Trifari
AGENT

*INVENTOR.*
JULIAN R. A. BEALE
*BY*
AGENT

United States Patent Office 3,704,177

Patented Nov. 28, 1972

3,704,177

METHODS OF MANUFACTURING A SEMICONDUCTOR DEVICE

Julian Robert Anthony Beale, Reigate, England, assignor to U.S. Philips Corporation, New York, N.Y.

Filed Dec. 15, 1970, Ser. No. 98,320
Claims priority, application Great Britain, Dec. 18, 1969, 61,729/69; Oct. 28, 1970, 61,729/70
Int. Cl. H01l 7/54
U.S. Cl. 148—1.5 11 Claims

ABSTRACT OF THE DISCLOSURE

A method for making a high-frequency bipolar transistor is described. The method employs selective ion implantation to form highly conducting mutually spaced stripe portions in the base region of the transistor. The stripe portions may be formed directly below and spaced from the emitter region. A heavy metal mask defined by electron-resist methods may be provided at least in the emitter window to selectively mask against the implantation.

This invention relates to methods of manufacturing a semiconductor device comprising a semiconductor body in which emitter, base and collector regions of a bipolar transistor are present, the base region being of the opposite conductivity type to the emittter and collector regions, and further relates to semiconductor devices manufactured by such methods. Such a semiconductor device may be a discrete bipolar transistor or an integrated circuit including a bipolar transistor as one of the circuit elements. The transistor may be a high frequency bipolar transistor, for example for operation in the gigahertz range.

The conductivity type determining impurity concentrations of the part of the base region of a bipolar transistor directly below the emitter region is often a compromise between a high value which is required for low intrinsic base resistance and a low value which is required for low emitter depletion capacitance. Such a compromise can seriously restrict the characteristics of a transistor, for example a high frequency transistor, manufactured having a substantially uniform impurity element concentration in its active base region.

It has been proposed to form a grid-like metallic structure in the base region of a bipolar transistor to reduce base resistance. However, the placing of metal electrodes within the base region in a semiconductor body is very difficult with very thin base regions.

It is proposed in U.S. patent specification No. 2,980,-830 to form by diffusion mutually spaced stripe portions, or "ribs," in the base region of a polar transistor which have another conductivity than another portion of the base region. Such stripe portions can reduce the base resistance. The specification describes complex out-diffusion and material removing stages in the formation of the stripe portions; such stages may be undesirable for semiconductor devices having particularly compact geometries. Furthermore it is not easy using diffusion techniques to control the location of such stripe portions in relation to the emiter-base and collector-base p-n junctions which factor affects the value of the junction capacitances and the cut-off frequency of the transistor, nor to control the impurity concentration to obtain sharply defined stripe portions having significantly higher conductivity than adjacent portions of the base region and a high impurity concentration gradient therebetween; it is found that significant minority charge carrier injection can occur in the base region at the transition between the stripe portions and adjacent portions of the base region where the said impurity concentration gradient is small, and this can cause degradation in the storage capacitance of the transistor. In addition, such diffused stripe portions may occupy a significant area and increase significantly the area occupied by the whole base region or result in a base region of greatly varying thickness.

It is desirable to form high conductivity stripe portions in the base region of a transistor using comparatively simple methods and without significantly affecting the emitter depletion capacitance, diffusion capacitance and total base area. The amount of control available in determining the location of impurity concentrations and concentration gradients associated with each stripe portion is an important factor in the formation of such stripe portions.

According to a first aspect of the invention, in a method of manufacturing a semiconductor device comprising a semiconductor body in which emitter, base and collector regions of a bipolar transistor are present, the base region being of the opposite conductivity type to the emitter and collector regions and comprising mutually spaced stripe portions which are situated directly below the emitter region and have a higher conductivity than an active portion of the base region situated therebetween, in which method, using ion implantation, impurity atoms characteristic of the said opposite conductivity type are implanted selectively in the semiconductor body through the semiconductor body portion where the emitter region is to be or is provided, the selectivity of implantation being arranged such that impurity atoms so implanted have maximum concentrations mutually spaced in the semiconductor body, and the energy of the bombarding impurity ions being chosen such that the said maximum concentrations occur at a depth greater than that at which the emitter-base junction is to be or is provided, the impurity atoms so implanted forming the said mutually spaced stripe portions of the base region.

The ion implantation is to be understood herein to include where appropriate an annealing treatment to restore the crystal lattice structure and to move impurity atoms into substitutional positions in the crystal lattice. This treatment can be performed by heating the semiconductor body simultaneous with or subsequent to the impurity ion bombardment. It will be evident that the final location of a juncture or junction between impurity concentrations in the body may be determined only during such an annealing treatment.

The provision of the stripe portions using selective implantation of impurity ions of a specified energy value or spectrum can be effected in a comparatively simple manner by selective scanning with a focussed ion beam and/or by selective masking of the semiconductor body against the ion implantation, and affords considerably more precise control of the configuration and location, the impurity concentration and concentration gradient of the said stripe portions in relation to other portions of the base region than is possible by presently used conventional diffusion techniques. In particular, such ion implantation through a mask permits very abrupt changes in three dimensions in the implanted impurity ion concentration, so that well-defined highly conductive stripe portions of the base region can be formed buried below the emitter region. In this manner, it is possible to manufacture a device in which the function of lateral conduction of base current and the function of current transport between emitter and collector are separated to a considerable extent between different portions of the base region below the emitter region. Such well-defined highly conductive stripe portions can provide low base resistance under the emitter region with little degradation of emitter depletion and diffusion capacitances and without increasing to an undesirable extent the total base area below the emitter region.

In some devices, the presence of other high conductivity stripe portions at parts of the base region beyond that directly below the emitter region will not adversely affect the device characteristics; in such cases, when forming the stripe portions situated directly below the emitter region, a large group of stripe portions may be provided and only moderate requirements need be placed on lateral registration and alignment between the position of the group of stripe portions and the body portion where the emitter region is to be or is provided.

Mutual spacing of the said stripe portions requires that the location of the maximum conductivity type determining impurity concentration of adjacent stripe portions be mutually spaced and larger in value than the conductivity type determining impurity concentration of an active portion of the base region situated therebetween. In one form the mutual spacing of the said stripe portions is effected using a focussed ion beam directed selectively at the semiconductor body surface. In another form a masking layer grid pattern is present at the bombarded surface to mask portions of the semiconductor body surface against the ion implantation to determine the mutual spacing of the stripe portions.

The very abrupt lateral changes in the implanted impurity concentration of the stripe portions that is obtainable using ion implantation is important in minimising the graded region between each stripe portion and an active portion of the base region. The diffusion capacitance per unit area of this graded region is high since the stripe portions are generally thicker than the active portions and the minority carrier diffusion constant is degraded by the additional impurity concentration. Thus the transit time in such a graded region is long, while the impurity concentration has not reached a high enough value to render the injection level low. With an impurity concentration in the stripe portions at least ten times that of the active portions of the base region, the injection level in the stripe portions is negligible. By using ion implantation in the formation of the stripe portions, high impurity concentration gradients are possible so that the impurity concentration of the stripe portions can rise to a value at least ten times that of the active portions in a distance which is small compared with the width of active portions of the base region; thus, the graded region is minimised and the storage capacitance due to the stripe portions becomes negligible.

When a masking layer grid pattern is employed to determine the mutual spacing of the said stripe portions, the masking layer grid pattern may have a structure defined by photolithographic and etching techniques; in this case, the mutual spacing of the stripe portions formed may be, for example, at most 2.5 microns.

The masking layer grid pattern may be of a heavy metal.

When the emitter region is formed by introduction of impurity atoms into the semiconductor body surface through an opening in a masking layer, such as a silica layer, the opening may be formed using photolithographic and etching techniques, a photosensitive resist which is exposed by ultraviolet light being used to define the opening in the masking layer. In such a case, when a masking layer grid pattern is employed to determine the mutual spacing of the implanted stripe portions directly below the semiconductor body portion in which the emitter region is or is to be provided, an electron sensitive layer bombarded by, for example, a focussed electron beam may be used to define the masking layer grid pattern. The masking layer grid pattern may be of a material formed using electron beam bombardment of portions of an electron sensitive layer, for example silica from a polymethylcyclosiloxane (PMCS) layer. In an alternative form, the masking layer grid pattern is of a heavy metal and has a structure defined by masking and etching techniques using an electron sensitive resist. The electron sensitive resist may be, for example, polymethylmethacrylate (PMMA) which is a positive resist, and the heavy metal may be, for example, chromium. Using such a method, comparatively sharp-edged stripe portions may be formed in which the conductivity type determining impurity concentration gradient at the edges of the stripe portions both transversely and longitudinally is comparatively large, and the mutually spacing of the stripe portions may be, for example, at most 1 micron.

When in operation of the device, current flows from the base contacts along the stripe portions to the active base region portions, then, if the stripe portions situated directly below the emitter region are well defined and comparatively closely spaced, the current flows in the active base region portions for a comparatively short distance only; this is equivalent to dividing the emitter region into a number of smaller emitter regions. If, for example, the emitter region of the transistor formed has the smallest width compatible with existing photolithographic techniques, the definition, using electron-beam techniques, of mutually spaced stripe portions below the semiconductor body portion in which the emitter region is or is to be provided has an effect on the transistor performance equivalent to the formation of several smaller emitter regions. This can be important for very high frequency transistors, for example transistors have an $f_T$ of 10 gigahertz or even higher.

For a practical high frequency bipolar transistor, a preferred range of values exists for the mutual spacing of the stripe portions. A lower limit is determined by the storage capacitance since the characteristics of closely spaced or merging stripe portions approximate towards those of a continuous high conductivity layer portion in the base region, and so a large forward bias would be required to inject therein a given value of emitter current. An upper limit is determined by the base resistance since this resistance is influenced by a factor of approximately $f.b^2/a^2$ where $a$ is the width of the emitter region, $b$ is the separation between the stripe portions of the base region, and $f$ has the value 2 for equal widths of stripe portions and intermediate base region portions.

Since the said stripe portions are formed using selective ion implantation, the maximum value of the conductivity type determining impurity concentration of each stripe portion can be comparatively high, while still retaining comparatively high conductivity type determining impurity concentration gradients at the edges of the stripe portions; the said maximum value may be, for example, at least one order of magnitude or even at least two orders of magnitude greater than the conductivity type determining impurity concentration of portions of the base region at the emitter-base junction and between the said stripe portions. Portions of the base region other than the stripe portions may be formed by diffusion, or they may be formed in a more precise manner by implantation. The conductivity type determining impurity concentration of the base region at the emitter-base junction and between the stripe portions may be, for example, of the order of $10^{17}$ atoms/cc. The maximum value of the conductivity type determining impurity concentration of each stripe portion may be, for example, at least $10^{19}$ atoms/cc. or even at least $10^{20}$ atoms/cc.

A sufficiently high ion dose may be used for the bombardment to render amorphous the areas of the monocrystalline semiconductor body where the stripe portions are provided. During a subsequent annealing treatment, for example at 800° C., the amorphous areas recrystallise to restore the monocrystalline lattice structure. The high value for the dose required to achieve such amorphous areas may be reduced by cooling the semiconductor body during implantation. Such processes generate a large number of vacancies in the crystal lattice which can be occupied by impurity element atoms so permitting a higher conductivity type determining impurity concentration in the stripe portions than can be formed by more conventional implantation processes.

In the formation of the stripe portions, the impurity atoms characteristic of the said opposite conductivity type may be implanted selectively in the semiconductor body through the body portion where the emitter region is to be or is provided and through adjacent body portions so that the said stripe portions extend longitudinally from below the emitter region. In this case, the said stripe portions may be formed by selective implantation through portions of a masking layer pattern, for example of silica, provided at the semiconductor body surface to mask semiconductor body portions against introduction of impurity atoms associated with the emitter region; in this case, the thickness of this emitter masking layer pattern is less than the range therein of the impurity atoms characteristic of the said opposite conductivity type and implanted to form the stripe portions.

High conductivity base contact regions may be provided at the semiconductor body surface beyond the body portion where the emitter region is to be or is provided, and the said stripe portions formed may extend longitudinally along mutually parallel directions and terminate at the high conductivity base contact regions. The high conductivity base contact regions may be locally diffused portions of the base region which are contacted subsequently by the base electrode. However, the mutually spaced stripe portions need not be parallel, since by selective implantation it is practical to produce other configurations. More than one selective implantation stage may be employed, for example using two selective implantation stages it is possible to form mutually orthogonal sets of highly conductive stripe portions in the base region, one set of which has a higher conductivity than the other set and has the base electrode connected subsequently thereto.

The maximum concentrations of the impurity atoms implanted through the semiconductor body portion where the emitter region is to be or is provided occur at a greater depth than that at which the emitter-base junction is to be or is provided, so that in the vicinity of the emitter-base junction in the manufactured device the conductivity type determining impurity concentration of each stripe portion formed decreases in the direction of the emitter-base junction; since the said stripe portions are formed using ion implantation, their conductivity type determining impurity concentration in the vicinity of the emitter-base junction can be considerably less than their maximum concentration. For a practical high frequency bipolar transistor manufactured in accordance with the invention, depending on the impurity concentration gradient, a preferred range of values exists for the spacing of the maximum value of the impurity concentration of the said stripe portions from the emitter-base junction; a lower limit for the spacing is determined by the emitter depletion capacitance, that is the space-charge capacitance associated with the emitter-base junction at a particular value of forward bias, and this capacitance affects the cut-off frequency of the transistor; an upper limit for the spacing is determined by the storage capacitance, since if the spacing is a significant fraction of the total undepleted portion of the active base region, charge storage in the spacing between the stripe portion and the emitter-base junction is a significant fraction of the injected charge carriers in the base region, and this degrades the $f_T$ of the transistor. Consequently, the degree of control available in determining by ion implantation the location and configuration of the said stripe portions in relation to the emitter-base junction is an important factor in the manufacture of such a device.

The whole emitter region may be provided by diffusion. However, to provide more precise control over the location of the active portion of the emitter-base junction in relation to the said stripe portions, at least the active portion of the emitter region at the emitter-base junction may be formed using ion implantation. Each stripe portion can have by ion implantation a comparatively high maximum impurity concentration; thus, the impurity concentrations of the active portions of the base region and emitter region may be provided such that the conductivity type determining impurity concentration of the emitter region at its junction with the stripe portions has a value intermediate between that of active portions of the base region at the emitter-base junction and the implanted maximum impurity concentration of each strip portion, so as to further reduce the emitter depletion capacitance. As the depletion capacitance of a junction depends on the net impurity concentration gradient at the junction, it can be an advantage to reduce this gradient by arranging that the junction between the emitter region and the stripe portions situated directly below the emitter region occurs where the emitter conductivity type determining impurity concentration is varying only slowly; this occurs near the peak of the emitter impurity element concentration profile. Thus, when the active portion of the emitter region at the emitter-base junction is formed using ion implantation, the implantations may be effected such that the junction between the emitter region and the stripe portions situated directly below the emitter region occurs in the vicinity of the maximum implanted impurity concentration of the active portion of the emitter region.

An embodiment of the invention will now be described, by way of example, with reference to the accompanying diagrammatic drawings, in which.

Figure 1:
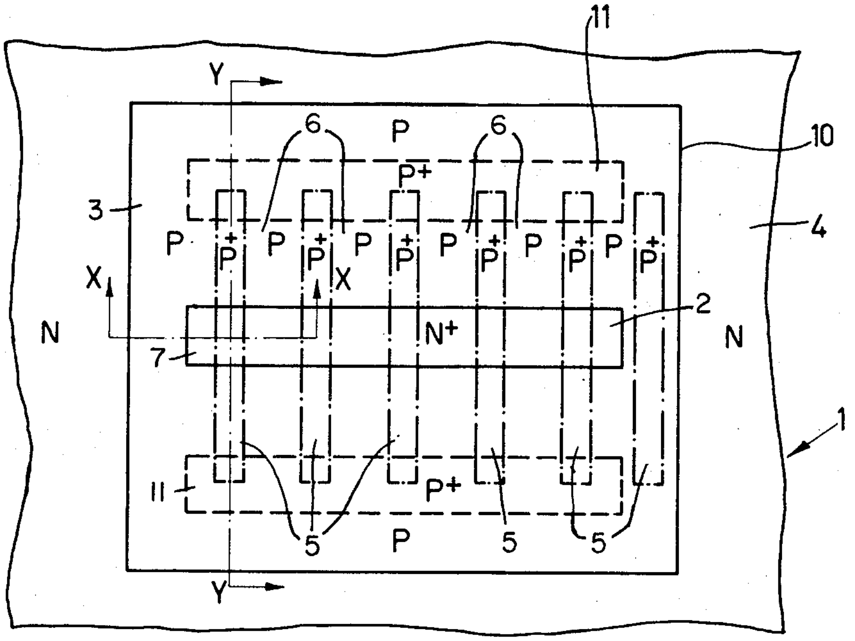
FIG. 1 is a plan view at the level of the semiconductor body surface of a portion of a semiconductor body of a discrete bipolar transistor.
Figure 2:
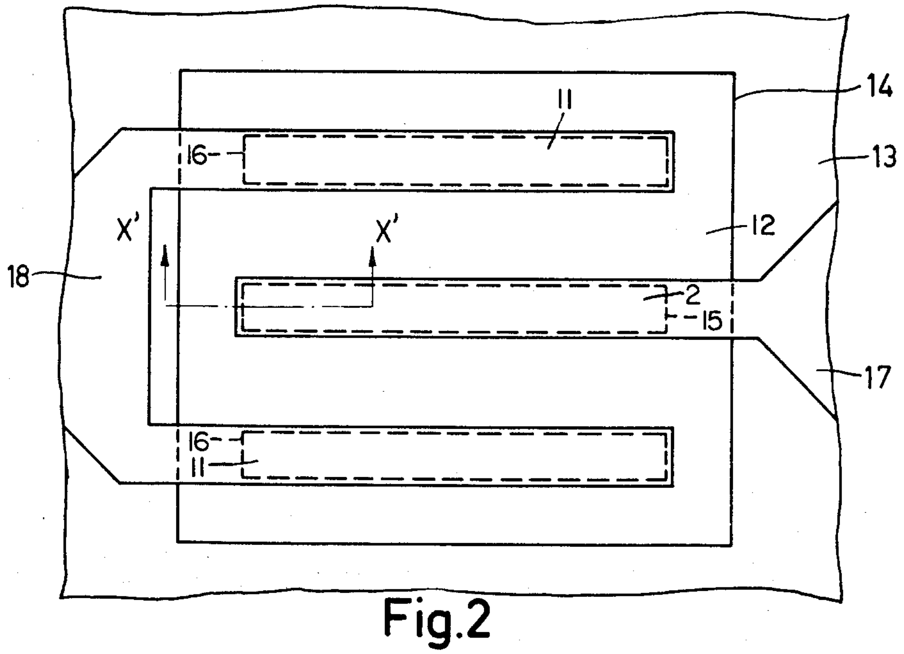
FIG. 2 is a plan view above the level of the semiconductor body surface of the portion of FIG. 1.
Figure 3:
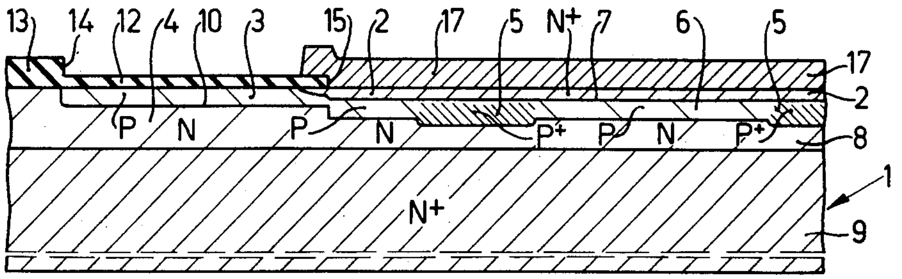
FIG. 3 is a cross-sectional view along the line X—X of FIG. 1 and the line X'—X' of FIG. 2.

The semiconductor device shown in FIGS. 1, 2 and 3 is a discrete n-p-n bipolar transistor comprising a monocrystalline silicon body 1 in which emitter, base and collector regions 2, 3 and 4 respectively are present. The p-type base region 3 comprises between the n-type emitter and collector regions 2 and 4 respectively a group of mutually spaced $p^+$ stripe portions 5 having a higher conductivity than active portions 6 of the base region situated between the $p^+$ stripe portions 5 and at the emitter-base p-n junction 7. Only six of these $p^+$ stripe portions are shown in the drawings so as to simplify the figures. These $p^+$ stripe portions 5 serve to reduce the intrinsic base resistance of the transistor. Most of the $p^+$ stripe portions 5 are situated directly below the emitter region 2.

The n-type collector region 4 comprises part of an epitaxial layer 8 which has a resistivity between 0.5 and 1 ohm-cm. on a high conductivity n-type substrate 9 having a resistivity of 0.008 ohm-cm. The collector contact is made to the opposite major surface of the high conductivity substrate 9.

The p-type base region 3 is a boron implanted region forming a collector-base p-n junction 10 with the adjacent n-type part of the epitaxial layer 8. The acceptor concentration in the $p^+$ stripe portions 5 of the base region 3 is provided by implanted boron ions and has a maximum values of $10^{19}$ atoms/cc. In a modified form of the device shown in FIGS. 1, 2 and 3, the said maximum value is $10^{20}$ atoms/cc. The acceptor concentration in active portions 6 of the base region 3 is of the order of $10^{17}$ boron atoms/cc. The location of the maximum acceptor concentration of each stripe portion 5 is spaced from the emitter-base p-n junction 7 to reduce the emitter depletion capacitance. The $p^+$ stripe portions 5 of the base region 3 extend longitudinally beyond the emitter region 2 along mutually parallel directions, and most of the stripe portions 5 terminate at high conductivity $p^+$ diffused contact regions 11 in the base region 3.

The emitter region 2 is, in the main, a phosphorus diffused region; however the major part of the donor concentration at the emitter-base junction 7 is provided by implanted phosphorus ions and is of the order of $10^{19}$ atoms/cc. In the said modified form of the device this donor concentration is $10^{18}$ atoms/cc.

An insulating and passivating layer is present on the surface of the epitaxial layer 8 and comprises a thin silica layer pattern 12 surrounded by a thick silica layer pattern 13. The step between the patterns 12 and 13 is designated by numeral 14 in FIGS. 2 and 3. The emitter region 2 and the base contact regions 11 are contacted at the surface of the epitaxial layer 8 through openings 15 and 16 in the thin silica layer pattern 12 by finger portions of emitter and base contact electrodes 17 and 18 respectively. The finger portions of the contact electrodes 17 and 18 form an interdigitated structure, and each of the contact electrodes 17 and 18 extends over the insulating layer patterns 12 and 13 to terminate in an enlarged contact area on the thick silica layer pattern 13.

The semiconductor device shown in FIGS. 1 to 3 is manufactured as follows:

The starting material is an n-type monocrystalline silicon body consisting of the $n^+$ substrate 9 of 0.008 ohm-cm. resistivity and 200 microns thickness on which is provided by epitaxial growth an n-type epitaxial layer 8' having a resistivity between 0.5 and 1 ohm-cm. and a thickness between 3 and 5 microns. The silicon body has its major surfaces normal to the (111) direction.

In general, several discrete bipolar transistors are manufactured from a common semiconductor wafer by forming an array of transistor elements simultaneously on the wafer and dividing the wafer to form individual semiconductor bodies for each discrete transistor. However, the method of manufacture described herein with reference to FIGS. 4 to 9 will be in terms of the semiconductor body for one discrete transistor rather than the whole semiconductor wafer. It will be evident that where steps such as photolithographic and etching techniques, diffusion, implantation and annealing are referred to, these operations are effected either simultaneously at a plurality of locations on the wafer or to the whole wafer so that a plurality of individual transistor elements are formed which are separated by dividing the wafer at a later stage of manufacture.

A layer 13' of silicon oxide of approximately 0.6 micron thickness is grown on the surface of the epitaxial layer 8' by maintaining the body at 1,200° C. in a stream of wet oxygen. By a photolithographic and etching step, two rectangular openings of approximately 4 microns by 20 microns are formed in the silicon oxide layer 13' to expose surface portions of the underlying n-type epitaxial layer 8'.

Figure 4:
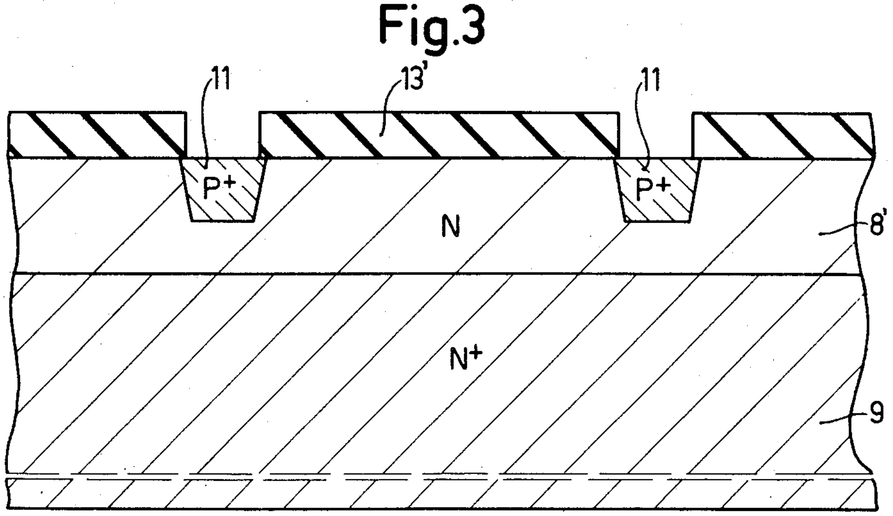
FIGS. 4, 5 and 8 are cross-sectional views of the part of the semiconductor body taken on the line Y—Y of FIG. 1 at different stages of manufacture.

The body is placed in a diffusion furnace and maintained at approximately 1,100° C. in a gas stream containing boron which is derived from a boron trioxide source. This results in the thermal diffusion of boron into the exposed surface portions of the epitaxial layer 8' to form in the n-type epitaxial layer 8' p-type diffused base contact regions 11. The silicon oxide layer 13' masks underlying surface portions of the epitaxial layer 8' against diffusion. The diffused boron surface concentration is at least $10^{19}$ atoms/cc. The resulting structure is shown in FIG. 4.

During the boron diffusion, the exposed surface portions of the epitaxial layer 8' become covered with a thin layer of borosilicate glass. The body is removed from the diffusion furnace and, the borosilicate glass and portions of the thick silica layer 13' are removed by a photolithographic and etching step to form the thick silica layer pattern 13 with a rectangular opening of 25 microns x 30 microns which defines subsequently the collector-base p-n junction 10 of the transistor. A further silica layer having a thickness of 0.2 micron is grown in the opening in the thick silica layer pattern 13, which layer pattern 13 is simultaneously thickened. By photolithographic and etching step, a rectangular opening 15 of 3 microns x 20 microns is formed in the further silica layer to form a thin silica layer pattern 12' and expose an n-type surface portion of the epitaxial layer 8' situated between the two diffused base contact regions 11. The two base contact regions 11 are situated below the thin silica layer pattern 12'.

Figure 5:
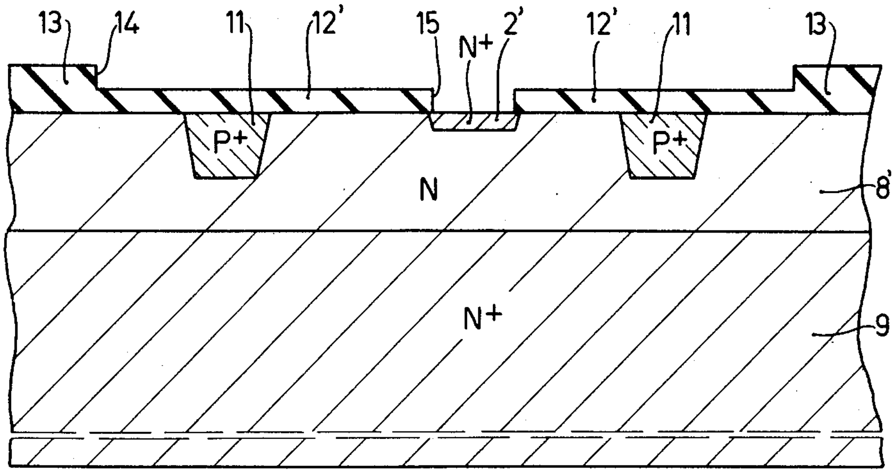
Figure 6:
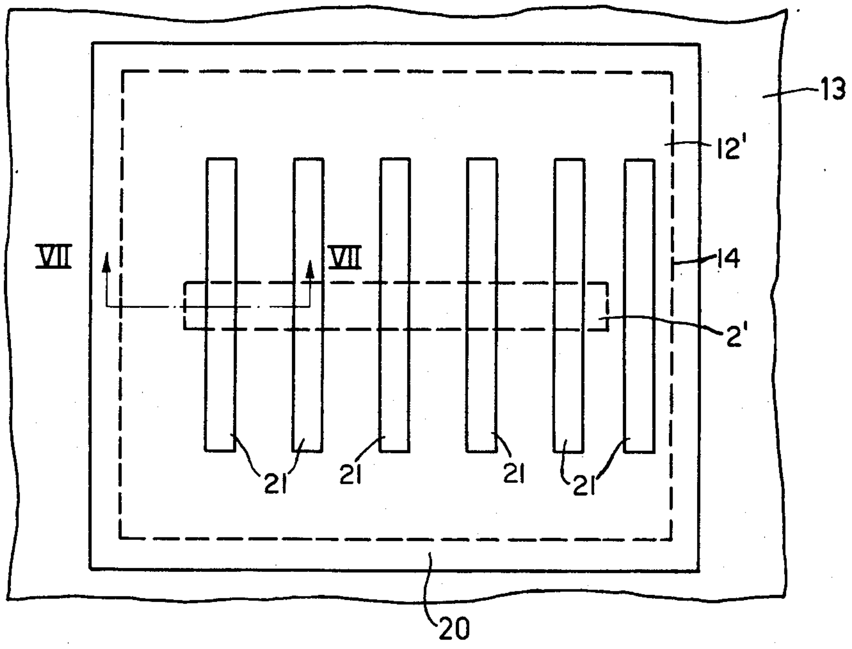
FIG. 6 is a plan view of the portion of FIGS. 1 and 2 at a stage of manufacture.
Figure 8:
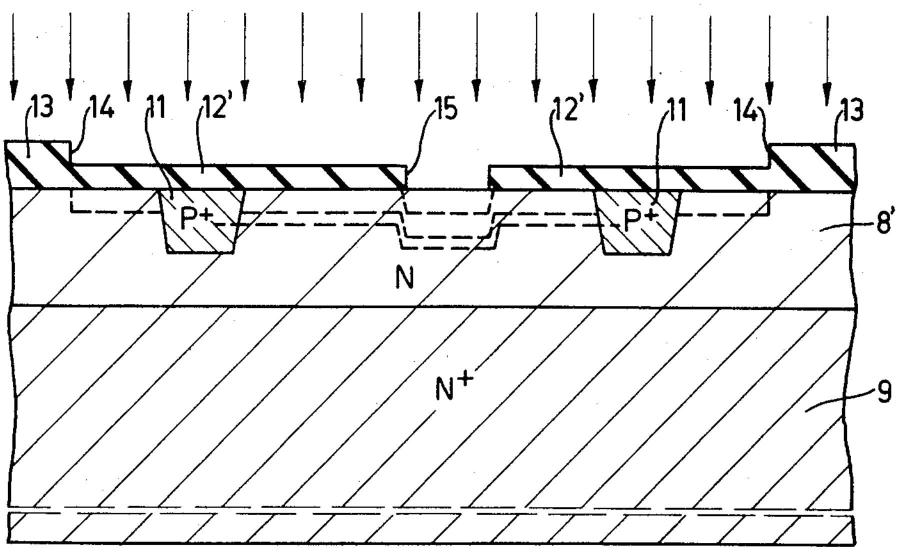

The body is placed in a diffusion furnace and maintained at 900° C. in a gas stream containing phosphorus which is derived from phosphine. This results in diffusion of phosphorus atoms into the exposed n-type surface portion to form a high conductivity $n^+$ region 2' adjacent the surface. The silica layer pattern 12' masks adjacent portions of the epitaxial layer against diffusion. The diffused phosphorus surface concentration is approximately $10^{20}$ atoms/cc. There is a tendency for an inflection to occur in the diffused phosphorus concentration profile so resulting in a low phosphorus concentration and concentration gradient in the vicinity of the juncture between the high conductivity $n^+$ region 2' and the adjacent n-type portion of the epitaxial layer 8'. The resulting body structure is shown in FIG. 5. During the diffusion step, a thin layer of phosphosilicate glass is formed on the exposed silicon surface portion and on the surface of the silicon oxide layer patterns 12' and 13.

During subsequent stages, the acceptor concentration of portions of the base region 3 are provided and the donor concentration gradient at the resulting emitter-base p-n junction substantially modified by implantation of boron and phosphorus atoms respectively using ion bombardment techniques.

The group of high conductivity $p^+$ stripe portions 5 of the base region 3 is provided by selective implantation of 100 kev. boron ions. A chromium layer is first formed by deposition on the silicon oxide layer patterns 12' and 13 and the phosphosilicate glass layer, and its outer periphery is defined on the thick silica layer pattern 13 by a photolithographic and etching step. A layer of polymethylmethacrylate (PMMA) which is an electron sensitive positive resist is provided on the chromium layer. By scanning the PMMA layer selectively with a focussed electron beam mutually parallel narrow rectangular portions of the PMMA layer extending over areas of the body approximately between the two base contact regions 11 are bombarded, and these bombarded rectangular portions are dissolved subsequently in a suitable solvent. The remaining PMMA layer pattern is hardened and acts as a mask during a subsequent etching stage to form a chromium layer pattern 20 having the structure shown in FIGS. 6 and 7. Through rectangular openings 21 in the chromium layer pattern 20 surface portons of the thin silicon oxide layer pattern 12' and the phosphosilicate glass in the opening 15 of the thin silica layer pattern 12' are exposed. The chromium layer pattern 20 acts as a mask for the selective implantation of boron atoms to form the high conductivity $p^+$ stripe portions 5 extending between the two base contact regions 11.

Figure 7:
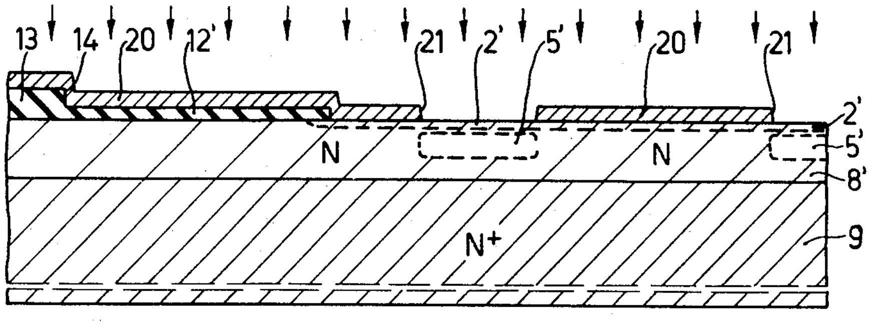
FIG. 7 is a cross-sectional view along the line VII—VII of FIG. 6.

The body is placed in the target chamber of an ion bombardment apparatus and as indicated by arrows in FIG. 7, bombarded at a low temperature with 100 kev. boron ions. The boron ion source consists of boron trichloride. The orientation of the body is such that there is an angle of 7° between the ion beam axis and the (111)

silicon crystal direction. The boron ion dose is at least $10^{15}$ atoms/cm.$^2$.

The 100 kev. boron ions are unable to penetrate the dense chromium layer pattern 20 but able to penetrate both the thin silica layer pattern 12' and the phosphosilicate glass. The implanted boron ions cause considerable damage to the silicon crystal lattice towards the end of the ion range and forms amorphous regions 5' in the otherwise monocrystalline silicon body, see FIG. 7. A large number of vacancies are associated with these amorphous regions, so that this treatment permits a large number of boron atoms to fill the vacancies and so occupy substantial lattice positions during a subsequent annealing treatment, for example at 800° C. In this manner, a high boron concentration is provided selectively in the epitaxial layer 8' to form the $p^+$ stripe portions 5, and depending on the exact value of the ion dose and on the bombardment time, the maximum value of the boron concentration associated with each stripe portion 5 so formed may be $10^{19}$ atoms/cc., or in the modified form of the device $10^{20}$ atoms/cc.

The use of the chromium layer pattern 20 as a mask to define the stripe portions 5 results in high boron concentration gradients both transversely and longitudinally at the edge of the stripe portions 5. The concentration gradient across the depth of each stripe portion 5 is determined by the deviation of the range of the 100 kev. bombarding boron ions in the silicon epitaxial layer 8' and, in general, this concentration gradient does not have such a high value. Nevertheless, in the region of the epitaxial layer 8' directly below the high conductivity $n^+$ region 2', the maximum boron concentration associated with each stripe is located at a depth from the surface of approximately 0.33 micron, whereas the boron concentrations 0.15 micron shallower and 0.15 micron deeper are a factor of 10 smaller. Consequently, comparatively well-defined high conductivity $p^+$ stripe portions 5 are formed in the epitaxial layer 8'. The range of the ions in silicon and silica is substantially the same so that the depth from the silicon surface of the maximum boron concentration of each stripe portion 5 extending below the thin silica layer pattern 12' and beyond the area directly below the high conductivity $n^+$ region 2' is approximately 0.13 micron.

The chromium layer pattern 20 is removed subsequently by etching to expose the whole of the thin silica layer pattern 12'. The body is replaced in the target chamber of the ion bombardment apparatus and as indicated by arrows in FIG. 8, bombarded first with a lower dose of boron ions and subsequently with phosphorus ions. The boron ion source consists of boron trichloride, and the phosphorus ion source of phosphorus trichloride. The orientation of the body is substantially the same as in the previous boron bombardment.

The boron bombardment is effected in one or more steps with energies in the range 60 to 90 kev. and the ion dose is of the order of $10^{12}$ atoms/cc.$^2$. The 60 to 90 kev. boron ions are unable to penetrate the thick silica layer pattern 13 but able to penetrate the thin silica layer pattern 12'. The boron ions are selectively implanted in the epitaxial layer 8', the boundary of the implanted region being determined by the step 14 between the thick and thin silica layer patterns 13 and 12'. After an annealing treatment at 800° C., these implanted boron ions form the acceptor concentration of the active portions 6 of the resulting p-type base region 3, which concentration is of the order of $10^{17}$ atoms/cc. The depth of the collector-base p-n junction formed with adjacent n-type portions of the epitaxial layer 8' is approximately 0.6 micron in the vicinity of a stripe portion 5 and 0.45 micron at active portions of the base region between the stripe portions 5. The difference in junction depth tends to introduce undesirable effects associated with the non-planar nature of the resulting collector-base junction, and may be reduced by using a lower average energy for the implantation of the stripe portions than for the implantation of other portions of the base region.

The implantation energy of the phosphorus ions is 70 kev. and the dose is approximately $10^{14}$ atoms/cc.$^2$. The 70 kev. phosphorus ions are unable to penetrate either of the silica layer patterns 12' and 13. Consequently, implantation of the phosphorus ions in the body occurs at the opening 15 in the thin silica layer pattern 12' associated with the previously diffused $n^+$ region 2'. After an annealing treatment at 600° C., the maximum value of the implanted phosphorus ions is $10^{19}$ atoms/cc. and occurs at a depth from the surface of approximately 0.085 micron. The resulting $n^+$ region is the emitter region of the transistor. In this manner, the major part of the donor concentration at the emitter-base p-n junction 7 is provided by implanted rather than diffused phosphorus ions. The depth of the resulting emitter-base junction 7 in the vicinity of a stripe portion 5 of the base region 3 is approximately 0.16 micron and at active portions 6 of the base region 3 between the stripe portions 5 is approximately 0.15 micron.

In the manufacture of the said modified form of the device, the energy of the bombarding phosphorus ions is greater than 70 kev. so that the maximum value of the implanted phosphorus ions is located at a greater depth from the surface. The bombardment time and/or ion dose is less so that the said maximum value has a value between the maximum concentration of each stripe 5 (approximately $10^{20}$ atoms/cc.) and the maximum concentration of other portions 6 of the base region 3 (approximately $10^{17}$ atoms/cc.), for example approximately $10^{18}$ atoms/cc. In this manner the net impurity element concentration gradient at the emitter-base junction 7 is reduced, and the emitter depletion capacitance is further reduced.

Figure 9:
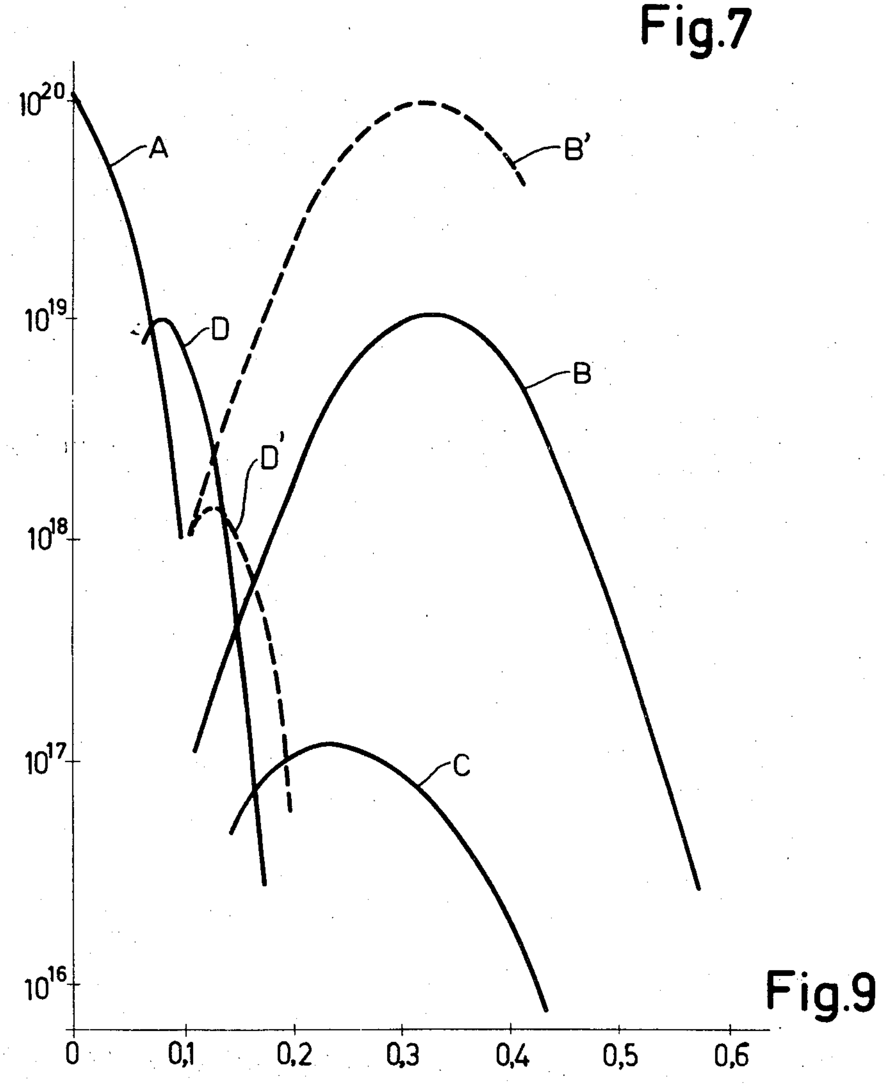
FIG. 9 is a graph showing impurity element concentration profiles of various semiconductor regions of the bipolar transistor.

Various impurity element concentration profiles are shown in FIG. 9, where the vertical axis represents the impurity element concentration in atoms/cc. and the horizontal axis represents depth in microns from the silicon surface in the opening 15. The diffused phosphorus profile is designated A; the implantation profile of 100 kev. boron ions is designated B, and in the modified form having the higher concentration, B'; the implantation profile of the 60 to 90 kev. boron ions is designated C; the implantation profile of 70 kev. phosphorus ions is designated D, and in the modified form with higher energy phosphorus ions and lower concentration D'.

Contact is made to the n-type emitter region 2 by a so-called "washed-out emitter technique," in which the emitter contact electrode 17 is provided in the same opening 15 in the silica layer pattern 12' as was employed for selective diffusion and implantation in the formation of the emitter region 2. This technique may be employed since the lateral spread of the diffused phosphorus atoms at the surface causes the emitter-base p-n junction 7 to terminate at the surface below the thin silica layer pattern 12' so preventing a short-circuit across the junction by the emitter contact electrode 17. Remaining portions of the thin phosphosilicate glass layer are removed to re-expose the surface portion of the n-type emitter region 2 in the opening 15, by dipping the body in a very weak hydrofluoric acid solution for a few seconds. By a further photolithographic and etching step, two rectangular openings 16 each of approximately 3 microns x 20 microns are formed in the thin silica layer pattern 12' to expose surface portions of the two p-type base contact regions 11.

A layer of aluminium of 0.5 micron thickness is then deposited over the whole surface. The aluminium layer is selectively removed by a photolithographic and etching step to leave the interdigitated emitter and base contact electrodes 17 and 18 respectively.

After dividing the wafer, the body comprising the transistor element is mounted in an envelope. Connections to the emitter and base bonding pads are made, and encapsulation is effected in a conventional manner.

It will be evident that in the embodiment described, by way of example, the order of the diffusion and implantation processing steps are chosen such that the temperatures involved are in descending order and the processes are essentially independent. Furthermore, it will be evident that many modifications of this embodiment are possible within the scope of the invention. If desired, in the device of FIGS. 1 to 3, the $p^+$ stripe portion 5 situated entirely beyond the area directly below the emitter region 2 may be omitted so that all the mutually spaced $p^+$ stripe portions 5 are situated directly below the emitter region 2. In general, those parts of the $p^+$ stripe portions situated below the centre of the emitter region 2 carry little current and merely contribute to the emitter depletion capacitance; thus, in certain cases, these parts of the $p^+$ stripe portions may be omitted, the resulting discontinuous stripe portions having an intentional break aligned approximately with the centre of the emitter region; such discontinuous mutually spaced $p^+$ stripe portions 5 of the base region 3 extending from below the emitter region 2 still serve as a low resistance path or paths to aid the flow of base current between active portions 6 of the base region 3 and the base contact electrode or electrodes 18.

What we claim is:

1. In the method of making a semiconductor device comprising a monocrystalline semiconductor wafer containing a bipolar transistor having a collector region of one-type conductivity, a base region of the opposite-type conductivity nested in the collector region and extending to a major wafer surface, and a surface emitter region of the one-type conductivity nested in the base region, and wherein the base region comprises spaced buried stripe portions of higher conductivity laterally separated by base active portions of lower conductivity and all extending below the emitter region, the improvement comprising forming the higher conductivity base stripe portions by selective ion implantation of active impurities through the region of the body to be occupied by the emitter region and in such manner that the implanted ions exhibit along an imaginary line extending substantially perpendicular to the base and through a stripe portion a concentration profile that reaches a maximum at a depth in the body greater than the depth of the emitter-base p-n junction formed by the emitter region and base active portions and such that the base stripe portions are well-defined and abruptly separated in terms of impurity concentration from the intervening base active portions.

2. A method as claimed in claim 1, wherein the said stripe portions are formed using a focussed ion beam directed selectively at the semiconductor wafer surface.

3. A method as claimed in claim 1, wherein a masking layer grid pattern is provided at the said wafer surface to mask portions of the semiconductor wafer surface against the ion implantation to determine the mutual spacing of the stripe portions.

4. A method as claimed in claim 3, wherein the masking layer grid pattern has a structure defined by masking and etching techniques using an electron-sensitive resist.

5. A method as claimed in claim 1, wherein a sufficiently high ion dose is used for the ion implantation to render amorphous the areas of the monocrystalline semiconductor wafer where the stripe portions are provided.

6. A method as claimed in claim 1, wherein the maximum value of the conductivity determining impurity element concentration of each of the stripe portions formed is at least one order of magnitude larger than that provided for base active portions at the emitter-base junction and between the said stripe portions.

7. A method as claimed in claim 6, wherein the conductivity determining impurity element concentration provided for active portions of the base region at the emitter-base junction and between the said stripe portions is of the order of $10^{17}$ atoms/cc.

8. A method as claimed in claim 1, wherein the said stripe portions are formed by selective implantation through portions of a masking layer pattern provided at the semiconductor wafer surface to mask semiconductor wafer portions against introduction of impurity atoms associated with the emitter region.

9. A method as claimed in claim 8, wherein high conductivity base contact regions are provided at the semiconductor wafer surface beyond the body portion where the emitter region is to be provided, and the said stripe portions formed extend along mutually parallel directions and terminate at the high conductivity base contact regions.

10. A method as claimed in claim 1, wherein at least the active portion of the emitter region at the emitter-base junction is formed using ion implantation.

11. A method as claimed in claim 1, wherein the impurity concentrations of the active portions of the base region and emitter region are provided such that the conductivity type determining impurity concentration of the emitter region at its junction with the stripe portions has a value intermediate between that of active portions of the base region at the emitter-base junction and the implanted maximum impurity concentration of each stripe portion.

References Cited

UNITED STATES PATENTS

| | | | |
|---|---|---|---|
| 2,980,830 | 4/1961 | Shockley | 148—33.2 |
| 3,434,894 | 3/1969 | Gale | 148—187 |
| 3,563,809 | 2/1971 | Wilson | 148—1.5 |
| 3,312,882 | 4/1967 | Pollock | 317—235 |
| 3,372,071 | 3/1968 | Wisman et al. | 148—187 |
| 3,558,366 | 1/1971 | Lepselter | 148—1.5 |
| 3,596,347 | 8/1971 | Beale et al. | 148—187 |

HYLAND BIZOT, Primary Examiner

J. M. DAVIS, Assistant Examiner

U.S. Cl. X.R.

148—187; 317—235 R